(12) United States Patent
Boussagol et al.

(10) Patent No.: US 7,615,468 B2
(45) Date of Patent: *Nov. 10, 2009

(54) METHODS FOR MAKING SUBSTRATES AND SUBSTRATES FORMED THEREFROM

(75) Inventors: Alice Boussagol, Brignoud (FR); Bruce Faure, Grenoble (FR); Bruno Ghyselen, Seyssinet (FR); Fabrice Letertre, Grenoble (FR); Olivier Rayssac, Grenoble (FR); Pierre Rayssac, legal representative, Clairvaux d'Aveyron (FR); Gisèle Rayssac, legal representative, Clairvaux d'Aveyron (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 91 days.

This patent is subject to a terminal disclaimer.

(21) Appl. No.: 11/840,696

(22) Filed: Aug. 17, 2007

(65) Prior Publication Data

US 2007/0287273 A1 Dec. 13, 2007

Related U.S. Application Data

(63) Continuation-in-part of application No. 11/505,668, filed on Aug. 16, 2006, and a continuation-in-part of application No. 10/883,437, filed on Jul. 1, 2004, now Pat. No. 7,265,029, which is a continuation of application No. 10/458,471, filed on Jun. 9, 2003, now abandoned, and a continuation-in-part of application No. 10/446,605, filed on May 27, 2003, now Pat. No. 6,794,276, which is a continuation of application No. PCT/FR01/03714, filed on Nov. 26, 2001.

(30) Foreign Application Priority Data

| Nov. 27, 2000 | (FR) | .................................. 00 15279 |
| Jun. 11, 2002 | (FR) | .................................. 02 07132 |
| Jan. 24, 2003 | (FR) | .................................. 03 00780 |
| Dec. 21, 2005 | (FR) | .................................. 05 13045 |

(51) Int. Cl.
- H01L 21/46 (2006.01)
- H01L 21/30 (2006.01)
- H01L 21/762 (2006.01)

(52) U.S. Cl. ............... 438/459; 438/455; 257/E21.567; 257/E21.568; 257/E21.569; 257/E21.57

(58) Field of Classification Search ................. 438/455, 438/459; 257/E21.567, E21.568, E21.569, 257/E21.57

See application file for complete search history.

(56) References Cited

U.S. PATENT DOCUMENTS 5,229,305 A 7/1993 Baker .......................... 438/459

(Continued)

FOREIGN PATENT DOCUMENTS

FR 2 681 472 A1 3/1993

(Continued)

OTHER PUBLICATIONS

Aspar et al., "Smart-Cut® process using metallic bonding: application to transfer of Si, GaAs, InP thin films," Electronics Letters, 35(12): 1024-1025 (1999).

(Continued)

*Primary Examiner*—Luan C Thai
(74) *Attorney, Agent, or Firm*—Winston & Strawn LLP

(57) ABSTRACT

A method for making substrates for use in optics, electronics, or opto-electronics. The method may include transferring a seed layer onto a receiving support and depositing a useful layer onto the seed layer. The thermal expansion coefficient of the receiving support may be identical to or slightly larger than the thermal expansion coefficient of the useful layer and the thermal expansion coefficient of the seed layer may be substantially equal to the thermal expansion coefficient of the receiving support. Preferably, the nucleation layer and the intermediate support have substantially the same chemical composition.

25 Claims, 4 Drawing Sheets

U.S. PATENT DOCUMENTS

| | | | |
|---|---|---|---|
| 5,374,564 A | 12/1994 | Bruel | 438/455 |
| 5,759,908 A | 6/1998 | Steckl et al. | 438/479 |
| 5,869,387 A | 2/1999 | Sato et al. | 438/459 |
| 5,877,070 A | 3/1999 | Goesele et al. | 438/458 |
| 5,880,491 A | 3/1999 | Soref et al. | 257/190 |
| 5,953,622 A | 9/1999 | Lee et al. | 438/458 |
| 5,985,687 A | 11/1999 | Bowers et al. | 438/46 |
| 6,020,252 A | 2/2000 | Aspar et al. | 438/458 |
| 6,103,597 A | 8/2000 | Aspar et al. | 438/458 |
| 6,114,188 A | 9/2000 | Oliver et al. | 438/107 |
| 6,190,998 B1 | 2/2001 | Bruel et al. | 438/407 |
| 6,225,192 B1 | 5/2001 | Aspar et al. | 438/460 |
| 6,251,754 B1 | 6/2001 | Ohshima et al. | 438/506 |
| 6,303,468 B1 | 10/2001 | Aspar et al. | 438/455 |
| 6,328,796 B1 | 12/2001 | Kub et al. | 117/94 |
| 6,426,270 B1 | 7/2002 | Sakaguchi et al. | 438/406 |
| 6,534,382 B1 | 3/2003 | Sakaguchi et al. | 438/455 |
| 6,756,286 B1 | 6/2004 | Moriceau et al. | 438/459 |
| 6,794,276 B2 | 9/2004 | Letertre et al. | 438/506 |
| 6,867,067 B2 | 3/2005 | Ghyselen et al. | 438/107 |
| 6,946,317 B2 | 9/2005 | Faure et al. | 438/94 |
| 7,029,993 B1 | 4/2006 | Barge et al. | 438/475 |
| 2003/0143772 A1 | 7/2003 | Chen | 438/47 |
| 2003/0219959 A1 | 11/2003 | Ghyselen et al. | 438/458 |
| 2004/0029359 A1 | 2/2004 | Letertre et al. | 438/458 |
| 2004/0235268 A1 | 11/2004 | Letertre et al. | 438/459 |
| 2005/0026394 A1 | 2/2005 | Letertre et al. | 438/459 |
| 2005/0266626 A1 | 12/2005 | Faure et al. | 438/197 |
| 2007/0072324 A1 | 3/2007 | Krames et al. | 438/46 |

FOREIGN PATENT DOCUMENTS

| | | |
|---|---|---|
| FR | 2 774 214 A1 | 7/1999 |
| FR | 2 787 919 A1 | 6/2000 |
| FR | 2 840 730 A1 | 12/2003 |
| WO | WO 00/44966 A1 | 8/2000 |
| WO | WO 02/37556 A1 | 5/2002 |
| WO | WO 02/43112 A2 | 5/2002 |
| WO | WO 02/43124 A2 | 5/2002 |

OTHER PUBLICATIONS

Bruel, "Silicon on insulator material technology," Electronics Letters, 31(14): 1201-1202 (1995).

Hobart et al., "Transfer of ultrathin silicon layers to polycrystalline SiC substrates for the growth of 3C-Sic epitaxial films," J. Electrochem. Soc., 146(10): 3833-3836 (1999).

MacKenzie et al., "Growth of III-Nitrides on ZnO, $LiGaO_2$, and $LiAlO_2$ substrates," J. Electrochem. Soc., 145(7): 2581-2585 (1998).

Motoki et al., "Preparation of large freestanding GaN substrates by hydride vapor phase epitaxy using GaAs as a starting substrate," Jpn. J. Appl. Phys., 40(2B): L140-L143 (2001).

Oda et al., "GaN bulk substrates for GaN based LEDs and LDs," Phys. Stat. Sol. (A), 180(1): 51-58 (2000).

Popovici et al., "Impurity contamination of GaN epitaxial films from the sapphire, SiC, and ZnO substrates," Appl. Phys. Lett., 71(23): 3385-3387 (1997).

Schnitzer et al., "30% external quantum efficiency from surface textured, thin-film light-emitting diodes," Appl. Phys. Lett. 63(16): 2174-2176 (1993).

Steckl et al., "Growth and characterization of GaN thin films on SiC SOI substrates," Journal of Electronic Materials, 26(3): 217-223 (1997).

Zahler et al., "Ge layer transfer to Si for photovoltaic applications," Thin Solid Films, 403-404: 558-562 (2002).

METHODS FOR MAKING SUBSTRATES AND SUBSTRATES FORMED THEREFROM

CROSS-REFERENCE TO RELATED APPLICATIONS

This application is (1) a continuation-in-part of application Ser. No. 11/505,668, filed Aug. 16, 2006, and (2) a continuation-in-part of application Ser. No. 10/883,437 filed Jul. 1, 2004 now U.S. Pat. No. 7,265,029, which application is (a) a continuation of application Ser. No. 10/458,471 filed Jun. 9, 2003, now abandoned, and (b) a continuation-in-part of application Ser. No. 10/446,605, filed on May 27, 2003, now U.S. Pat. No. 6,794,276, which application is a continuation of International Application PCT/FR01/03714 filed Nov. 26, 2001. The entire content of each prior application is expressly incorporated herein by reference thereto.

FIELD OF THE INVENTION

The present invention relates to methods for making substrates and substrates for use in optics, electronics or opto-electronics and, in particular, substrates which may be used for making solar cells, light-emitting diodes and lasers.

BACKGROUND OF THE INVENTION

In the field of substrates for optics, electronics or opto-electronics, two main types of methods are well known for forming a thin layer on a supporting substrate. According to a first type of method, a thin layer taken from a donor substrate is transferred onto a receiving supporting substrate to obtain substrates including a thin useful layer. Useful layer is the layer of the substrate on which electronic components such as, for example, light-emitting diodes or other components may be made.

According to second type of method, the thin layer is deposited on a receiving supporting substrate by a deposition technique. This deposition technique may notably consist of epitaxy or chemical vapor deposition. Regardless of the type of method used for forming a useful layer on a receiving supporting substrate, in some instances it is necessary to remove at least one portion of the receiving support to obtain a final substrate including at least the useful layer. Such removal of the receiving support results in loss of materials, thereby putting a strain on the manufacturing costs of such substrates.

In order to find a remedy to this drawback, a method for making substrates has been devised which includes a useful thin layer method in which the receiving supporting substrate is removed in order to be recycled. Such a method is described in an alternative embodiment of U.S. Pat. No. 6,794,276, which describes a method for making substrates. This method includes a step for transferring a seed layer on a receiving support by molecular adhesion at a bonding interface, a step for epitaxy of a useful layer on the seed layer and a step for applying stresses in order to lead to removal of the assembly (i.e., removal of the seed layer and of the useful layer from the receiving support at the bonding interface). Seed layer is the material layer which allows development of the epitaxied useful layer.

In U.S. Pat. No. 6,794,276, certain specifications are required for allowing the seed layer to adapt to thermal expansions of the receiving support and the useful layer during heat treatments to which the substrate is subject. For this purpose, it is recommended that the seed layer has sufficiently small thickness, of the order of 0.5 microns, and preferably less than 1,000 Å. U.S. Pat. No. 6,794,276 also mentions the fact that the receiving support consists of a material for which the thermal expansion coefficient is 0.7 to 3 times larger than that of the useful layer. It is specified that the thermal expansion coefficient is the proportionality coefficient of the change in the length of a solid as a function of the initial length of the solid and of its change in temperature according to the following formula:

$$\Delta L = \alpha L_0 \Delta T \text{ where } \alpha = \text{thermal expansion coefficient}$$

In an alternative embodiment, the method taught by U.S. Pat. No. 6,794,276 allows the receiving supporting substrate to be reused after its removal.

It is desirable to improve the method taught by U.S. Pat. No. 6,794,276. In particular, improvements are needed for reducing the risk of breaking the substrate, deteriorating, cracking the seed layer or the occurrence of a residual deflection of the final substrate making it unusable during the various heat treatments applied to the substrate. These improvements are now provided by the present invention.

SUMMARY OF THE INVENTION

The invention relates to a method for making substrates for optics, electronics, or opto-electronics which includes providing a donor substrate and a receiving substrate, wherein the receiving substrate has a thermal expansion coefficient; operably connecting the donor substrate to the receiving substrate; forming a seed layer on the receiving substrate, wherein the seed layer has a surface and a thermal expansion coefficient; and epitaxy of a useful layer on the seed layer, wherein the useful layer has a thermal expansion coefficient. Advantageously, the thermal expansion coefficient of the receiving substrate is equal to or greater than the thermal expansion coefficient of the useful layer, and the thermal expansion coefficient of the seed layer is about the same as the thermal expansion coefficient of the receiving substrate so that the seed layer and the receiving support expand in substantially the same way to avoid stressing or deforming the seed layer. Preferably, the nucleation layer and the intermediate support have substantially the same chemical composition.

In another embodiment, the method for making substrates includes providing a donor substrate and a receiving support; forming a seed layer from the donor substrate; transferring the seed layer onto the receiving support; and forming a useful layer on the seed layer. Again, the thermal expansion coefficient of the receiving support is equal to or greater than the thermal expansion coefficient of the useful layer, and the thermal expansion coefficient of the seed layer is about equal to the thermal expansion coefficient of the receiving support so that the seed layer and the receiving support expand in substantially the same way to avoid stressing or deforming the seed layer.

Thus, during subsequent heat treatments which the structure will undergo, the seed layer and the receiving support may substantially expand in the same way. The receiving support may expand slightly less than the seed layer so that the seed layer may be placed under slight compression avoiding any deterioration of the seed layer.

In a preferred embodiment, the seed layer may consist of a material for which the thermal expansion coefficient is equal to $(1+\epsilon)$ times that of the receiving support, with $\epsilon$ of the order of 0.2, and preferably $\epsilon$ equals 0.1. Further, the useful layer may consist of a material for which the thermal expansion coefficient may be larger than or equal to $(1 \pm \epsilon')$ times that of the receiving support, with a typical value of 0.2 for $\epsilon'$. The seed layer and/or the receiving support may be made of, for example, silicon, germanium, silicon carbide, GaN or sapphire. Moreover, the chemical composition of the seed layer, advantageously, may be identical to that of the receiving support.

A composite substrate may be created using the method described herein. The composite substrate may be used for optics, electronics, or opto-electronics. The substrate may have at least one seed layer on a receiving support, and an epitaxied useful layer on the seed layer. The thermal expansion coefficient of the receiving support may be identical to or slightly larger than the thermal expansion coefficient of the useful layer, and the thermal expansion coefficient of the seed layer may be substantially equal to the thermal expansion coefficient of the receiving support so that the seed layer and the receiving support expand in substantially the same way to avoid stressing or deforming the seed layer.

Other advantages and features will become better apparent from the description which follows of several alternative embodiments, given as non-limiting examples, of the method for making substrates according to the invention as well as of the substrate obtained by the method.

BRIEF DESCRIPTION OF THE DRAWINGS

The present invention can be better understood by reference to the following drawings, wherein like references numerals represent like elements. The drawings are merely exemplary to illustrate certain features that may be used singularly or in combination with other features and the present invention should not be limited to the embodiments shown.

DETAILED DESCRIPTION OF THE PREFERRED EMBODIMENTS

Figure 1:
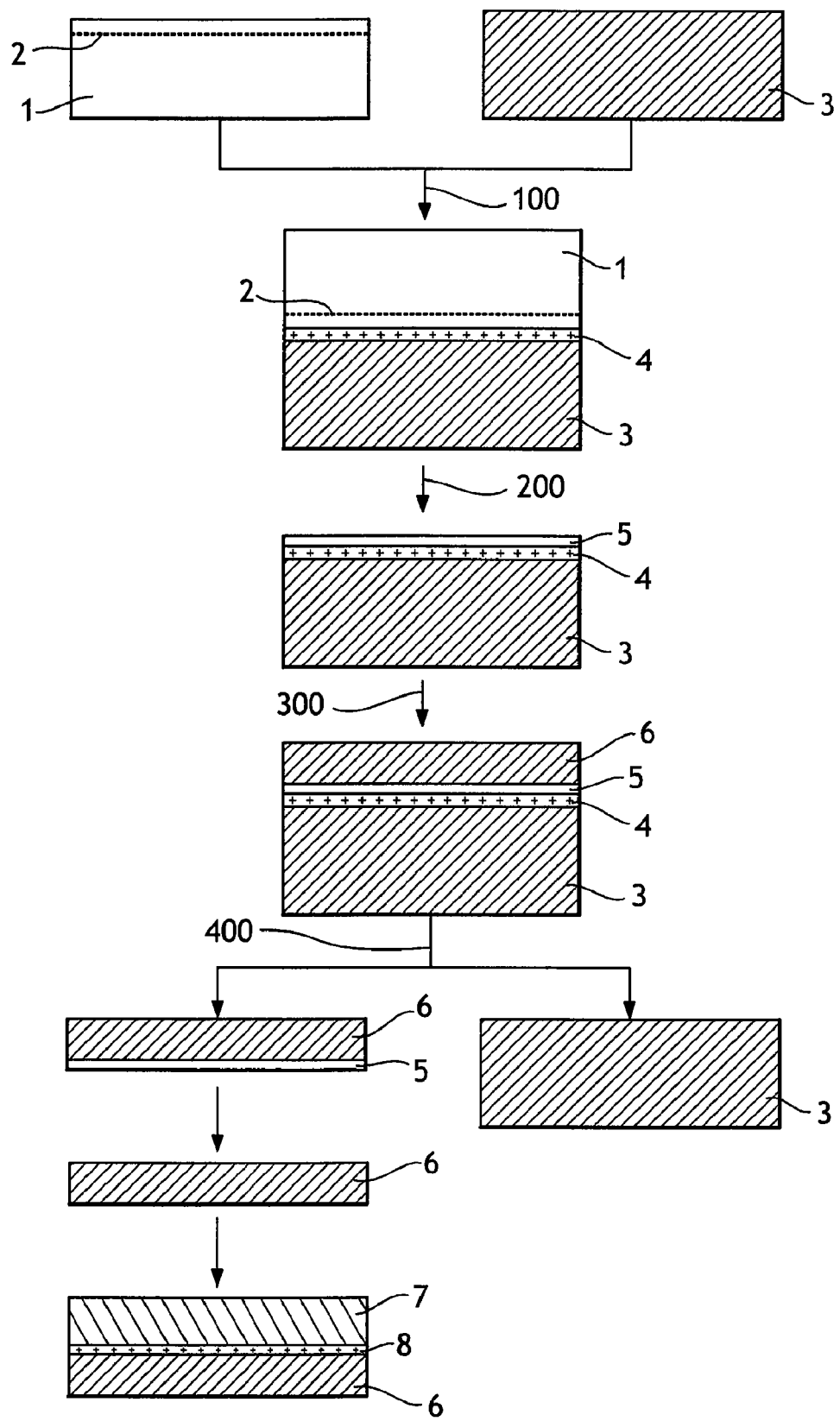
FIG. 1 is a schematic illustration of the steps of an exemplary embodiment of a method for making a substrate.

Throughout this application, the term "donor substrate" is also referred to as a "source substrate." Also, the term "receiving substrate" can be used to refer to the "intermediate support," the "support substrate" or the "support layer" as appropriate for the embodiment. The "seed layer" is also referred to as a "nucleation layer." The "detachment zone" is also referred to as a "weakened zone." The "final support" is sometimes referred to as a "target substrate."

The invention relates to methods for fabricating a semiconductor substrate. In an implementation, the method includes providing an intermediate support 20, providing a nucleation layer 12, and providing at least one bonding layer 13 or 23 between the intermediate support 20 and the nucleation layer 12 to improve the bonding energy therebetween, and to form an intermediate assembly. The technique also includes providing at least one layer of a semiconductor material 30 upon the nucleation layer 12, bonding a target substrate 40 to the deposited semiconductor material to form a support assembly that includes the target substrate 40, the deposited semiconductor material, and the intermediate assembly, and then processing the support assembly to remove the intermediate assembly. The result is a semiconductor substrate that includes the at least one layer of semiconductor material 30 on the target substrate 40. Preferably, the intermediate assembly is conveniently removed by etching, such as with an acid solution.

Preferably, the nucleation layer 12 functions as a barrier layer against diffusion of atoms from the intermediate support 20 at epitaxial growth temperatures, and the semiconductor material layer 30 is epitaxially deposited on the nucleation layer 12. If desired, a second barrier layer may be provided between the nucleation layer 12 and the intermediate support 20 prior to epitaxially depositing the semiconductor material layer. In an advantageous embodiment, the intermediate support 20 includes a barrier layer that is resistant to diffusing elements derived from dissociation of the intermediate support 20 at epitaxial growth temperatures, and the semiconductor material is epitaxially deposited on the nucleation layer 12. In an implementation, the barrier layer is first applied to the intermediate support and then the nucleation layer is applied to the barrier layer. A layer of adhesive may be applied to at least one of a surface of the barrier layer or a surface of the nucleation layer to define a bonding layer 13 or 23. Generally, at least one of the barrier layer or the nucleation layer 12 is formed by a deposition technique.

The intermediate assembly is advantageously provided by implanting atomic species into at least a portion of a source substrate 10 to define the nucleation layer 12, wherein a main concentration of implanted atomic species defines a detachment zone 14, applying the at least one bonding layer 13 or 23 to at least one of a surface of the nucleation layer 12 or to at least a portion of a surface of the intermediate support 20, attaching the source substrate 10 implanted with the atomic species, the at least one bonding layer 13 or 23, and at least a portion of the intermediate support 20 together to form a structure, and treating the structure to detach the intermediate assembly from the source substrate at the detachment zone 14.

According to this aspect of the invention, the intermediate support 20 is preferably selected from the group consisting of silicon, gallium arsenide, zinc oxide, lithium gallium oxide and lithium aluminum oxide. In addition, the nucleation layer 12 may include at least one of silicon carbide, gallium nitride, or sapphire. The semiconductor material also preferably is made of at least one of a mono or poly-metallic nitride, and in particular gallium nitride. The nucleation layer 12 is preferably selected from the group consisting of silicon carbide, gallium nitride and sapphire. If desired, the final support assembly may further include a reflective coating.

Preferably, the at least one bonding layer 13 or 23 is made of at least one of silicon oxide or silicon nitride. The target substrate 40 may be made of at least one of monocrystalline or polycrystalline silicon. Advantageously, the final support 40 is chemically treated to remove at least one of the intermediate support 20 or the nucleation layer 12.

Another aspect of a method for fabricating a semiconductor substrate according to the invention includes transferring a seed layer 12 on to a support substrate 20, depositing a working layer 30 on the seed layer 12 to form a composite substrate, and detaching the seed layer 12 and the working layer 30 from the composite substrate to form the semiconductor substrate. In this implementation, the material of the seed layer 12 is suitable for accommodating the thermal expansion of the support substrate 20 and the thermal expansion of the working layer 30.

Preferably, the support substrate 20 comprises a material having thermal expansion coefficients that minimize stresses that arise during variations in temperature. Advantageously, the seed layer 12 is transferred onto the support substrate 20 by molecular adhesion. In an implementation, the seed layer 12 and the working layer 30 are detached from the composite substrate by the application of stress at the adhesion interface, wherein the stress is selected from the group consisting of mechanical stress, thermal stress, electrostatic stress and laser irradiation stress, or a combination thereof.

In an implementation, the working layer 30 is made of gallium nitride. In addition, the seed layer 12 may be made of a material from the group consisting of sapphire, silicon carbide, zinc oxide, silicon, gallium nitride, neodymium gallate, and lithium gallate. The support substrate 20 may be made of a material selected from the group consisting of silicon carbide, aluminum nitride, silicon, and sapphire. Advantageously, the seed layer 12 and the support substrate 20 have substantially the same chemical composition.

In a beneficial embodiment, the method further includes applying an intermediate layer between the seed layer 12 and the support substrate 20. The intermediate layer may be at least one of a bonding layer 13 or 23 or an insulating layer.

Preferably, the seed layer 12 includes a crystal lattice parameter sufficient for the epitaxial growth of the working layer 30 on the seed layer 12 such that the working layer 30 has a dislocation concentration less than about $10^7/cm^2$. An advantageous implementation includes providing a source substrate 10 including the seed layer 12 and a weakened zone 14, and detaching the seed layer 12 from the source substrate at 10 the weakened zone 14, and transfer it to the intermediate support 20. In this embodiment, the weakened zone 14 includes implanted atomic species at a depth that corresponds to the thickness of the source substrate 10, and the seed layer 12 may be detached from the source substrate 10 by application of at least one of heat treatment, mechanical stress, chemical etching, or a combination thereof.

The method according to this aspect of the invention preferably further includes preparing the seed layer 12 to receive the working layer 30, wherein the preparation includes at least one of polishing, annealing, smoothing, oxidation, and etching. The method may also advantageously include removing the support substrate 20 such that it remains in a condition sufficient for recycling and reuse.

With reference to FIG. 1, the method according to the invention includes a step for implanting atomic species at a determined depth in a donor substrate 1 in order to form a weakened area 2. In step 100, the donor substrate may be boned upon or otherwise adhered onto a receiving substrate 3 by any appropriate means known in the art.

As referred to below, bonding may mean intimate contact of the donor substrate 1 with the receiving substrate 3 in order to join the donor substrate 1 and the receiving substrate 3 by molecular adhesion. Bonding may be obtained according to various methods such as, for example, (1) having a surface of the donor substrate 1 come into direct contact with a surface of the receiving substrate; (2) forming a bonding layer in order to make a connecting layer on the surface of the donor substrate 1, forming a bonding layer in order to make a second connecting layer on the surface of the receiving supporting substrate 3 and having the surfaces of the respective connecting layers of the donor substrate 1 and the donor substrate 3 come into contact with each other; and (3) forming a bonding layer on only one of both substrates. In one embodiment, the bonding layer may consist of, for example, an insulating layer or a dielectric layer. In such an embodiment, the donor substrate 1 may be bonded onto the receiving substrate 3 by means of a bonding layer 4 deposited on the surface of the donor substrate and/or the receiving substrate 3. In addition, an annealing step may be applied at this stage for strengthening the bonding interface between the bonding layer 4 and the surface of the donor substrate 1 and/or the receiving substrate 3. Nonetheless, bonding may be achieved according to any of the methods known to one skilled in the art.

In step 200, a seed layer 5 may be detached from the donor substrate 1 at the weakened area 2. Thereafter, in step 300 a useful layer 6 may be deposited on the surface of the seed layer 5. In one preferred embodiment, the useful layer 6 may be obtained by epitaxy, which is well known to one skilled in the art, according to step 300. The step 200 for implanting atomic species and for detaching the seed layer 5 corresponds to a SMART-CUT® method, a general description of which is found in the publication Silicon-On-Insulator Technology: Materials to VLSI, 2nd Edition of Jean-Pierre Colinge, Kluwer Academic Publishers, p. 50 and 51. Those skilled in the art will appreciate that detachment of the seed layer 5 and of the donor substrate 1 may be achieved by an operation such as, for example, heat treatment, application of mechanical stresses, chemical etching, or a combination of at least two of these operations.

The seed layer 5 may consist of a material for which the thermal expansion coefficient is equal to $(1+\epsilon)$ times that of the receiving support 3, with $\epsilon$ of the order of 0.2, and preferably $\epsilon$ equals 0.1. It will however be observed that thermal expansion may vary with temperature, with the deposition technique, with the defects present inside the layers and also with the measurement techniques. Thus, when the structure is undergoing heat treatments (e.g., during detachment of the seed layer 5 and the useful layer 6 of the receiving substrate 3) the seed layer 5 and the receiving support 3 will substantially expand in the same way. The receiving support 3 will expand slightly less than the seed layer 5 so that the latter may be placed under slight compression, thereby avoiding deterioration of the seed layer 5.

The useful layer 6 may consist of a material which has a thermal expansion coefficient which is larger than or equal to $(1\pm\epsilon')$ times that of the receiving support 3, with the value of $\epsilon'$ between 0 and 0.8 and, preferably, between 0.2 and 0.3. Expansions of the different layers 5, 6 and the receiving support 3 of the same order of magnitude during heat treatments may be obtained because of the closeness of the thermal expansion coefficients of the useful layer 6, the seed layer 5 and the receiving support 3. In this way, any risk of deterioration of the substrate or occurrence of a residual deflection of the final substrate may be avoided.

The seed layer 5 and/or the receiving support 3 may comprise a material such as, for example, silicon (e.g., {111} silicon), germanium, polycrystalline or monocrystalline silicon carbide, GaN, polycrystalline or monocrystalline AlN, and sapphire. Further, the chemical composition of the seed layer 5 may be identical with that of the receiving support 3.

Between the steps for detaching 200 and for depositing 300 the useful layer, the method may also include steps for preparing the surface of the seed layer 5. These preparation steps may include, for example, polishing, annealing, smooth annealing operations (e.g., under hydrogen), annealing operations for strengthening the bond, sacrificial oxidization interface operations (i.e., for oxidizing and then removing the oxidized material), etching operations, etc.

Step 400 may lead to detachment at the bonding layer 4 of the assembly, consisting of the seed layer 5 and the useful layer 6, from the receiving support 3. If a self-supported substrate is desired, the assembly formed by the seed layer 5 and the useful layer 6 may only be able to be detached from the receiving support 3 if the thickness of the assembly is greater than or equal to 50 µm.

In order to perform the detachment, different techniques may be used. For example, detachment may be accomplished by application of mechanical, thermal, electrostatic stresses; application of any type of etching (wet, dry, gas, etching, plasma etching, etc.) and/or application of any type of etching by irradiation such as laser irradiation (e.g., by chemical etchings at the bonding layer 4), or the like. The receiving substrate 3, which may either be destroyed or recycled in order to reuse it during the making of a new substrate, may then be obtained on the one hand, and a structure consisting of the seed layer 5 and the useful layer 6 may be obtained on the other hand. It will be appreciated that for performing the detachment of the assembly (consisting of the seed layer 5 and the useful layer 6) from the receiving support 3 at the bonding layer 4, chemical etching may advantageously be used if the receiving substrate 3 is intended to be destroyed. On the other hand, if the receiving substrate 3 is intended to be recycled for reuse, mechanical stress or chemical etching of the bonding layer 4 may preferably be used, which provides full detachment of substrate 3. The seed layer 5 may then be removed by any appropriate means known to those skilled in the art.

Thereafter, the useful layer 6 may be transferred onto a final supporting substrate 7. The final support 7 may be made of a material such as, for example, semi-conducting or semi-conductive materials (e.g., silicon, germanium, etc.), metals (e.g., copper), plastic materials and glasses. Since the resultant structure no longer undergoes any heat treatment, the final supporting substrate 7 may be made with any material which has a thermal expansion coefficient and/or a lattice parameter different from those of the useful layer 6.

In a preferred embodiment, the useful layer 6 may be transferred onto the final supporting substrate 7 by bonding. The bond may be obtained by applying a bonding layer 8 on one of the surfaces of the useful layer 6 and/or the final supporting substrate 7. Similar to selecting the final substrate 7, the bonding techniques applied in this step are not limited by temperature resistance, contaminations, the thermal expansion coefficient and/or the lattice parameter of the useful layer 6.

The layer 8 used may comprise, for example, organic layers (e.g., insulating layers of the $SiO_2$, $Si_3N_4$, or polyimides), conductive metal interfaces and seals (e.g., palladium silicide $Pd_2Si$, tungsten silicide $WSi_2$, SiAu, or PdIn). The conductive interfaces may then provide the contact on the rear face of the layer.

Moreover, structures may be buried in this bonding layer 8 so that a rear junction contact of a triple junction may thereby be made for producing solar cells. In one embodiment, the buried structure may consist of a triple junction based on amorphous silicon of the n-i-p type. This buried structure may have a lower layer (i.e., a rear contact layer) consisting of metallization, such as silver (Ag) or aluminium (Al), on which a conducting transparent oxide may be deposited. The rear contact layer, on the one hand, may provide an electrical contact with which the triple junction solar cell may be connected and a rear mirror, on the other hand, allowing reflection of light which has not been absorbed by the solar cell. The latter may consist of three amorphous silicon layers (of type n, i and p, respectively) successively deposited on the rear contact layer. It will be appreciated by those skilled in that art that when making LEDs, mirrors may also be buried in the bonding layer 8.

In an alternative embodiment (not illustrated in FIG. 1), the useful layer 6 and the seed layer 5 may be transferred onto the final supporting substrate 7 with or without the bonding layer 8 prior to removing the seed layer 5.

Figure 2:
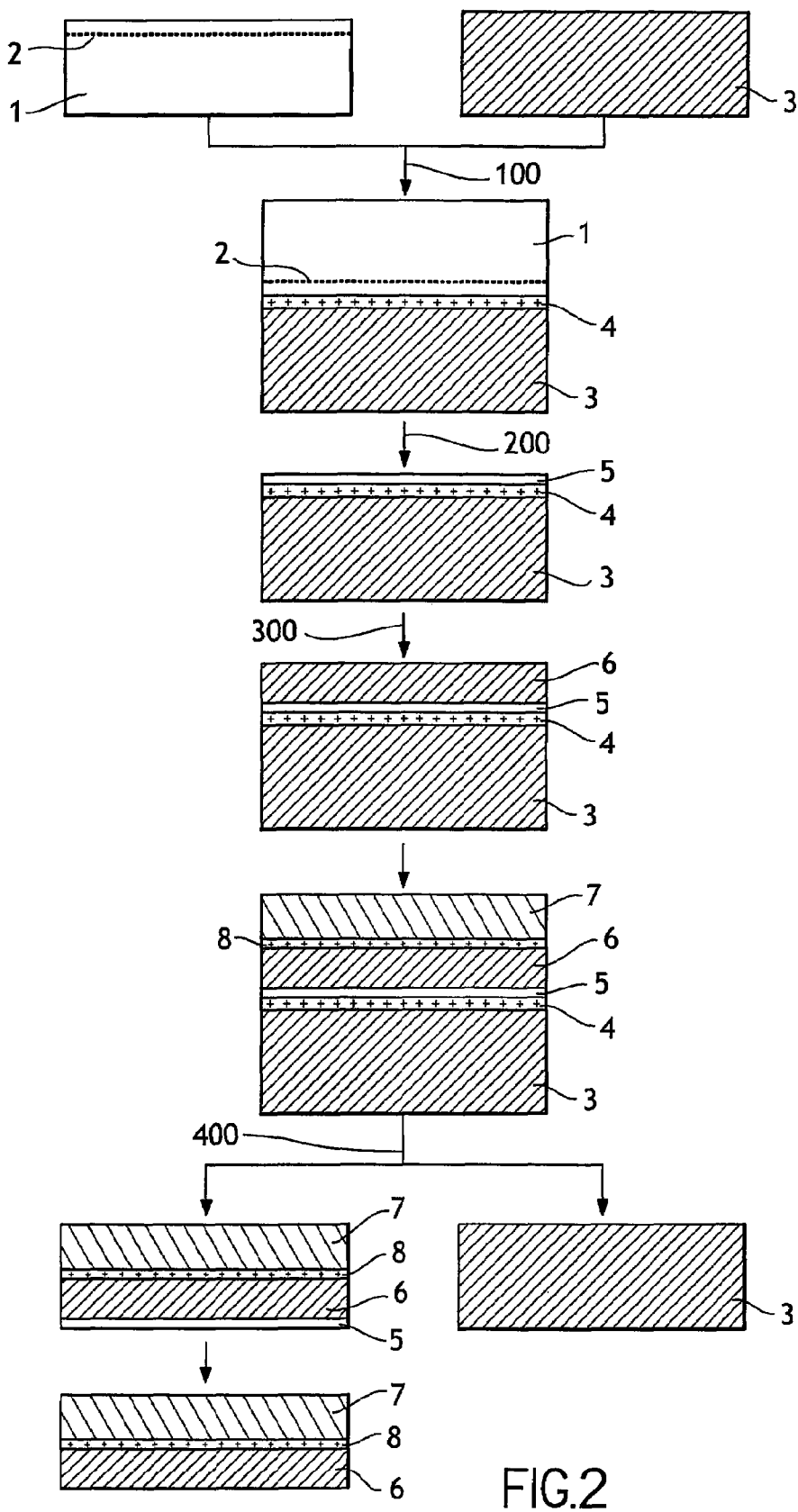
FIG. 2 is a schematic illustration of the steps of an alternative exemplary embodiment of a method for making a substrate.
Figure 3A:
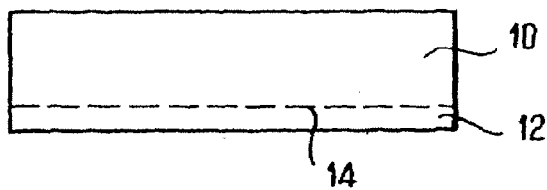
FIGS. 3A to 3G illustrate the successive steps of a method in accordance with one embodiment of the invention.
Figure 3B:
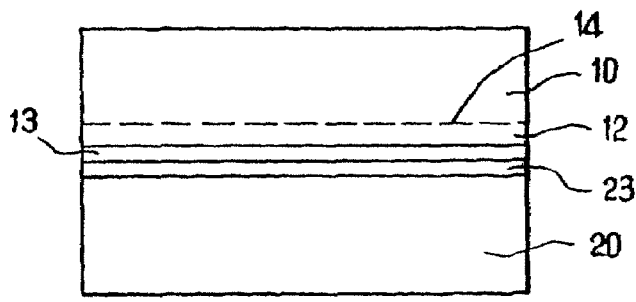
Figure 3C:
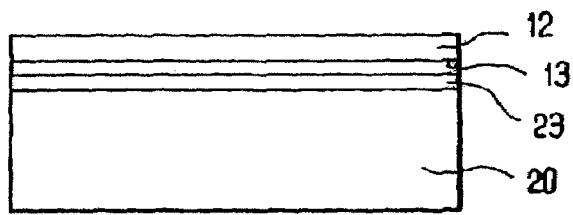
Figure 3D:
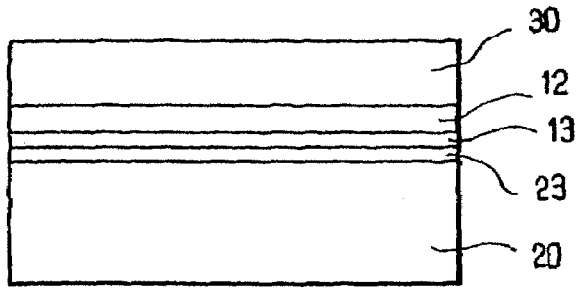
Figure 3E:
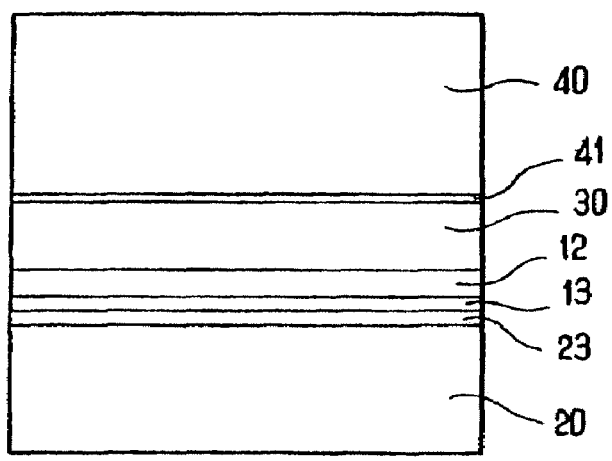
Figure 3F:
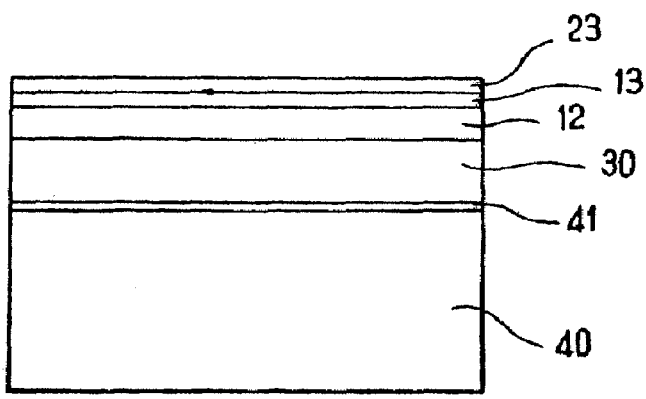
Figure 3G:
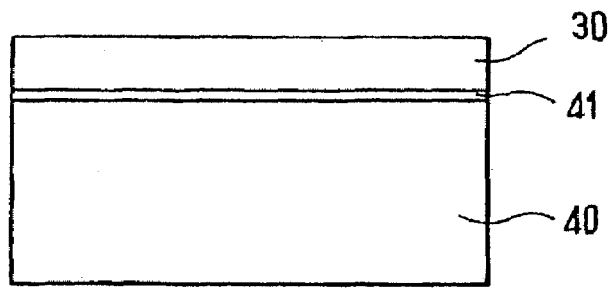

Referring now to FIG. 2, atomic species may be implanted in the same way as previously discussed—at a determined depth of a donor substrate 1—in order to form a weakened area 2. The donor substrate 1 in step 100 may then be adhered on a receiving substrate 3 by any appropriate means. In step 200, a seed layer 5 may be detached from the donor substrate 1 at the weakened area 2. Thereafter, in step 300, a useful layer 6 may be deposited on the surface of the seed layer 5. Detachment of the seed layer 5 and the donor substrate 1 may be achieved by an operation such as, for example, heat treatment, application of mechanical stresses and chemical etching, or a combination of at least two of these operations.

In another alternative embodiment, the seed layer 5 may originate from the thinning of the donor substrate (for example according to a BESOI type method) before depositing the useful layer 6. The final supporting substrate 7 may then be transferred onto the useful layer 6 by means of a bonding layer 8. Stresses may be applied in order detach the structure, which may consist of the seed layer 5, the useful layer 6, the bonding layer 8 and the final supporting substrate 7, from the receiving support 3 at the bonding layer 4. A receiving substrate 3, ready to be recycled, may be obtained on the one hand and a structure consisting of the seed layer 5, the useful layer 6, the bonding layer 8 and the final supporting substrate 7 may be obtained on the other hand. The seed layer 5 may then be removed by any appropriate means in order to obtain the final substrate.

EXAMPLES

Two particular but non-limiting exemplary embodiments of a resultant substrate will be described hereafter with reference to FIG. 2. The substrates are intended for making solar cells (Example 1) and light-emitting diodes (Example 2). It should be noted, however, that the examples are not intended to be limiting as to the fields of application of the invention.

Example 1

According to this example, a weakened area 2 may be made by implanting atomic species at a determined depth in the donor substrate 1 which may be made of, for example, germanium (Ge). The receiving substrate 3, which may also be made of Ge, may be bonded to the donor substrate 1 by means of a bonding layer 4. The bonding layer 4, preferably made of nitride or oxide, may be formed on the face of at least one of the donor 1 or receiving 3 substrates.

As shown in step 200, a seed layer 5 of Ge may be detached from the donor substrate 1 at the weakened area 2 using the SMART-CUT® method as described herein. The seed layer 5 of Ge may have a thermal expansion coefficient (which is also noted as CTE) which varies from 4.6 to 6.67 $10^{-6}$ for temperatures ranging from 25° C. to 600° C. Detachment of the seed layer 5 and the donor substrate 1 may be achieved by an operation such as, for example, heat treatment, application of mechanical stresses and chemical etching, or a combination of at least two of these operations.

As illustrated in step 300, a useful gallium arsenide layer 6 may then be deposited on the surface of the seed layer 5. The CTE of AsGa may be from 5.00 to 7.4 $10^{-6}$ for temperatures ranging from 25° C. to 600° C. Different layers, such as, for example, InP, AsGa, GaInP, InGaAs, InGaAlP, or InGaAsN epitaxied layers, may be successively deposited by epitaxy on the deposit of the AsGa layer in order to form an epitaxial stack for making junctions (e.g., triple junctions, quadruple junctions, etc.). It will be appreciated that the useful layer 6 may have a crystalline quality at least equal to the crystalline quality which may be obtained by epitaxy on a massive Ge substrate.

The useful layer 6 and the seed layer 5 may then be transferred onto a final supporting substrate 7. It will be noted that the final support 7 may also be contacted with the epitaxial stack if the latter is made beforehand. The final support 7 may be made of a material such as, for example, semi-conductors (e.g., silicon, germanium), plastic materials and glasses. Transfer of the useful layer 6 and the seed layer 5 onto the final supporting substrate 7 may be performed by bonding. The bond may be performed using a bonding layer 8 made of, for example, insulating layers (e.g., $SiO_2$, $Si_3N_4$, etc.), organic layers (e.g., polyimides), metal layers (e.g., palladium silicide $Pd_2Si$ and tungsten silicide $WSi_2$), and seals (e.g., SiAu, PdIn, etc.).

The final supporting substrate 7, the seed layer 5 and the useful layer 6 may then be detached by any appropriate means, for example, at the bonding layer 4 from the receiving support 3. The receiving support 3 may thereafter be recycled advantageously. This detachment may be obtained by applying stresses at the bonding interface such as, for example, mechanical stresses, thermal stresses, electrostatic stresses and stresses from laser irradiation. Thereafter, the seed layer may be removed in order to obtain the final substrate consisting of the final supporting substrate 7 of the bonding layer 8 and the useful layer 6 or the epitaxial stack.

Example 2

A weakened area 2 may be achieved by implanting atomic species at a determined depth in the donor substrate 1 made of massive sapphire which has a CTE that varies from 4 to 9.03 $10^{-6}$ for temperatures ranging from 25° C. to 1,000° C. The implantation may consists of implanting hydrogen at a dose between $0.5 \times 10^{17}$ and $3 \times 10^{17}$ at/cm², preferably, between 1 and $2 \times 10^{17}$ at/cm² and an energy of the order of 20 to 210 keV, preferably 100 keV. The receiving substrate 3 also may also be made of massive sapphire and may be adhered to the substrate 1 by means of a bonding layer 4. The bonding layer 4 may reach a thickness of one micron which may thereby facilitate subsequent detachment of the receiving supporting substrate 3 by side chemical etching of this bonding layer 4.

As shown in step 200, a seed layer 5 of sapphire may be detached from the donor substrate 1 at the weakened area 2 by following the SMART-CUT® method. Thereafter, in step 300, useful layers 6 may be deposited on the surface of the seed layer 5. The useful layers 6 may be deposited by epitaxy based on, for example, GaN, AlN, InGaN, InN and their ternary compounds (AlGaN, InGaN).

Detachment of the seed layer 5 and the donor substrate 1 may be achieved by an operation such as, for example, heat treatment, application of mechanical stresses and chemical etching, or a combination of at least two of these operations. The useful layer 6 and the seed layer 5 may then be transferred onto a final supporting substrate 7 of sapphire or a material such as, for example, silicon, copper, plastic materials, and glass. This transfer of the useful layer 6 and the seed layer 5 onto the final supporting substrate 7 may be performed by bonding. The bond being obtained by using a bonding layer made of, for example, insulating layers (e.g., $SiO_2$, $Si_3N_4$, etc), organic layers (e.g., polyimides), metal layers(e.g., palladium silicide $Pd_2Si$ and tungsten silicide $WSi_2$) or seals (e.g., SiAu , PdIn).

The final supporting substrate 7, the seed layer 5 and the useful layer 6 may then be detached by any appropriate means, at the bonding layer 4, from the receiving support 3. The receiving support 3 may advantageously be recycled.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. One skilled in the art will appreciate that the invention may be used with many modifications of structure, arrangement, proportions, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims, and not limited to the foregoing description.

What is claimed is:

1. A method for fabricating a semiconductor substrate, comprising:
   providing an intermediate support;
   providing a nucleation layer, wherein the nucleation layer and the intermediate support have substantially the same chemical composition;
   providing at least one bonding layer between the intermediate support and the nucleation layer to improve the bonding energy therebetween, and to form an intermediate assembly;
   depositing at least one layer of a semiconductor material upon the nucleation layer;
   bonding a target substrate to the deposited semiconductor material to form a support assembly comprising the target substrate, the deposited semiconductor material, and the intermediate assembly; and
   processing the support assembly to remove the intermediate assembly to provide a semiconductor substrate comprising the at least one layer of semiconductor material on the target substrate.

2. The method of claim 1, which further comprises providing a barrier layer between the nucleation layer and the intermediate support prior to epitaxially depositing the semiconductor material layer.

3. The method of claim 2, wherein the barrier layer is resistant to diffusing elements derived from dissociation of the intermediate support at epitaxial growth temperatures, and wherein the semiconductor material is epitaxially deposited on the nucleation layer.

4. The method of claim 2, wherein the barrier layer is formed by a deposition technique.

5. The method of claim 4, wherein the barrier layer is first applied to the intermediate support and then the nucleation layer is applied to the barrier layer.

6. The method of claim 2, wherein a layer of adhesive is applied to at least one of a surface of the barrier layer or a surface of the nucleation layer to define a bonding layer.

7. The method of claim 1, wherein the nucleation layer is formed by a deposition technique.

8. The method of claim 1, wherein the intermediate assembly is removed by etching.

9. The method of claim 8, wherein the intermediate assembly is etched with an acid solution.

10. The method of claim 1, wherein the intermediate assembly is provided by:
    implanting atomic species into at least a portion of a source substrate to define the nucleation layer, wherein a main concentration of implanted atomic species defines a detachment zone;

applying the at least one bonding layer to at least one of a surface of the nucleation layer or to at least a portion of a surface of the intermediate support;

attaching the source substrate implanted with the atomic species, the at least one bonding layer, and at least a portion of the intermediate support together to form a structure; and;

treating the structure to detach the intermediate assembly from the source substrate at the detachment zone.

11. The method of claim 10, wherein the treating step comprises applying thermal or mechanical stress to detach the nucleation layer from the source substrate.

12. The method of claim 10, which further comprises affixing the nucleation layer to the at least one bonding layer and to the intermediate support by molecular bonding.

13. The method of claim 1, wherein the intermediate support and nucleation layer are made of a material selected from the group consisting of silicon, gallium arsenide, zinc oxide, lithium gallium oxide and lithium aluminum oxide.

14. The method of claim 1, wherein the semiconductor material comprises at least one mono or poly-metallic nitride.

15. The method of claim 1, wherein the semiconductor material layer comprises gallium nitride, and further wherein the nucleation layer is selected from the group consisting of silicon carbide, gallium nitride and sapphire.

16. The method of claim 1, wherein the final support assembly further comprises a reflective coating.

17. The method of claim 1, wherein the at least one bonding layer comprises at least one of silicon oxide or silicon nitride.

18. The method of claim 1, wherein the target substrate comprises at least one of monocrystalline or polycrystalline silicon.

19. The method of claim 1, wherein the final support is chemically treated to remove at least one of the intermediate support or the nucleation layer.

20. The method of claim 1, wherein the nucleation layer includes a crystal lattice parameter sufficient for the epitaxial growth of the working layer on the nucleation layer such that the semiconductor layer has a dislocation concentration less than about $10^7/cm^2$.

21. The method of claim 1, further comprising providing a source substrate including the nucleation layer and a weakened zone, and detaching the nucleation layer from the source substrate at the weakened zone to transfer it to the intermediate support.

22. The method of claim 21, wherein the weakened zone comprises implanted atomic species at a depth that corresponds to the thickness of the source substrate.

23. The method of claim 21, wherein the nucleation layer is detached from the source substrate by application of at least one of heat treatment, mechanical stress, chemical etching, or a combination thereof.

24. The method of claim 1, which further comprises preparing the nucleation layer to receive the semiconductor layer, wherein the preparation includes at least one of polishing, annealing, smoothing, oxidation, and etching.

25. The method of claim 1, further comprising removing the intermediate support such that it remains in a condition sufficient for recycling and reuse.

* * * * *

UNITED STATES PATENT AND TRADEMARK OFFICE
CERTIFICATE OF CORRECTION

PATENT NO. : 7,615,468 B2  Page 1 of 1
APPLICATION NO. : 11/840696
DATED : November 10, 2009
INVENTOR(S) : Boussagol et al.

It is certified that error appears in the above-identified patent and that said Letters Patent is hereby corrected as shown below:

Title Page:
Item (75) Inventors, after "Fabrice Letertre," change "Grenoble" to -- Meylan --.

Signed and Sealed this

Twenty-second Day of December, 2009

David J. Kappos
*Director of the United States Patent and Trademark Office*